United States Patent
Nanao et al.

(10) Patent No.: US 6,756,844 B2
(45) Date of Patent: Jun. 29, 2004

(54) DISTORTION COMPENSATION AMPLIFICATION APPARATUS OF FEED FORWARD TYPE AND ADAPTIVE PRE-DISTORTION TYPE

(75) Inventors: Yoshinari Nanao, Tokyo (JP); Matsuo Satoh, Tokyo (JP); Masahiro Matsuda, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/127,568

(22) Filed: Apr. 23, 2002

(65) Prior Publication Data

US 2003/0030490 A1 Feb. 13, 2003

(30) Foreign Application Priority Data

Aug. 7, 2001 (JP) .................................... 2001-239839
Mar. 5, 2002 (JP) .................................... 2002-058239

(51) Int. Cl.[7] .................................................. H03F 1/26
(52) U.S. Cl. ........................................ 330/149; 330/151
(58) Field of Search ........................... 330/52, 149, 151

(56) References Cited

U.S. PATENT DOCUMENTS 5,625,322 A  4/1997 Gourgue et al. ............ 330/129
6,223,056 B1  4/2001 Appel ......................... 455/561
6,320,464 B1 * 11/2001 Suzuki et al. ................ 330/151
6,496,064 B2 * 12/2002 Rzyski ....................... 330/151

FOREIGN PATENT DOCUMENTS

| JP | 8265052 | 10/1996 |
| JP | 5048346 | 2/1999 |
| JP | 00315921 | 11/2000 |
| JP | 2001223541 A * | 8/2001 |

* cited by examiner

Primary Examiner—Khanh Van Nguyen
(74) Attorney, Agent, or Firm—Bacon & Thomas, PLLC

(57) ABSTRACT

A feed forward type distortion compensation amplification apparatus, which includes a distortion detection loop and a distortion compensation loop, cancels a first distortion element generated from the distortion detection loop by a second distortion element generated from the distortion compensation loop to generate an output signal, and controls bias levels of the main amplifier and the error amplifier based on a level of the output signal. An adaptive pre-distortion type distortion compensation amplification apparatus includes a detection unit for detecting an input power level, a control unit for storing the input power level and a bias level corresponding thereto and generating the bias level in response to the input power level, and a bias control unit for applying a bias to an amplifier unit in response to the bias level.

4 Claims, 14 Drawing Sheets

| OUTPUT POWER LEVEL | MAIN AMP BIAS LEVEL | ERROR AMP BIAS LEVEL |
|---|---|---|
| A | A' | A" |
| B | B' | B" |
| C | C' | C" |

| INPUT POWER LEVEL | AMP BIAS LEVEL |
|---|---|
| A | A' |
| B | B' |
| C | C' |

DISTORTION COMPENSATION AMPLIFICATION APPARATUS OF FEED FORWARD TYPE AND ADAPTIVE PRE-DISTORTION TYPE

FIELD OF THE INVENTION

The present invention relates to an amplification apparatus; and, more particularly, to a distortion compensation amplification apparatus capable of reducing power consumption by way of employing an automatic bias control scheme.

BACKGROUND OF THE INVENTION

In a mobile communications system, a base station transmits an amplified high frequency multi-carrier signal having a plurality of carriers separated from each other by different frequency bands and respectively modulated in a proper way, Required in a radio amplification apparatus used in such base station of the mobile communications system are low power consumption and a high linearity as well as a high efficiency of a radio transmission circuit incorporated therein. Since an amplification apparatus with a poor linearity produces large distortion, e.g., inter-modulation distortion, which hampers the realization of a normal and a high quality communication, the amplification apparatus for use in the amplification of the multi-carrier signal is required to exhibit good linearity characteristics across the whole frequency band the multi-carrier signal belongs to.

One among various methods for satisfying such a linearity requirement of the amplification apparatus is a feed forward distortion compensation technique. First, referred to as the term 'main line' in the following description is a signal path from an input terminal to an output terminal via a main amplifier, i.e., a signal path for transferring a to-be-amplified signal and an amplified signal.

In the feed forward distortion compensation technique, a distortion detection loop is arranged in such a manner as to couple a signal branched from a position at the back end of the main amplifier to a signal sampled from somewhere in front of the main amplifier on the main line. If the two signals have same amplitudes but with inverse phases, the carrier signals are cancelled out by the above-described signal coupling operation of the distortion detection loop and, then, an error signal corresponding distortion components introduced by the main amplifier and its neighboring circuits can be outputted.

The feed forward distortion compensation technique further employs a distortion compensation loop for re-coupling the error signal outputted from the distortion detection loop to the signal on the main line. The distortion components produced by the main amplifier can be compensated by compensating on the main line a signal delay in the distortion compensating loop and, further by appropriately performing an adjustment on the amplitude and the phase of the signal on the distortion compensation loop or the main line, in such a manner that the distortion components in the signal on the main line and the signal obtained from the distortion compensation loop are controlled to have identical amplitudes but with inverse phases.

The feed forward distortion compensation technique will now be described hereinafter in further detail with reference to FIG. 15.

Referring to FIG. 15, there is provided a conventional distortion compensation amplification apparatus having a feed forward configuration. The feed forward distortion compensation amplification apparatus includes two blocks: one is a distortion detection loop block including a directional coupler 1, a phase shifter 2, an amplitude adjuster 3, a pilot signal generator 4, a coupler 5 and a main amplifier 6; and the other is a distortion compensation loop block including a coupler 8, a detector 9, a phase shifter 10, an amplitude adjuster 11 and an error amplifier 12. The feed forward distortion compensation apparatus further includes dividers 7 and 13, a termination device 14, a coupler 15 and a control unit 18 for controlling each element of the feed forward distortion compensation amplification apparatus.

Within the distortion detection loop block there exist two routes: one is a distortion-free route of a→c→e→g; and the other is a distortion route through a→b→d→f. At the point of "g", only the distortion component is extracted by way of, e.g., inverting the signs of the transfer functions. At this time, the control unit 18 performs an automatic control on the phase shifter 2 and the amplitude adjuster 3 such that a received signal level of the distortion component measured by the detector 9 is minimized.

Another widely employed technique for achieving a good linearity in an amplification apparatus is an adaptive pre-distortion compensation technique (hereinafter referred to as an ADP technique) using a digital signal processing scheme. The ADP technique in general can be classified as a radio signal input type and a base band signal input type. Referring to FIGS. 16A and 16B, there are provided distortion compensation amplification apparatuses of such types.

FIG. 16A shows a distortion compensation amplification apparatus of the radio signal input type. A radio signal is inputted to an input terminal 21 and is successively subjected to a delay circuit 22, a gain control circuit 23 and a phase control circuit 24 and then, amplified at a power amplifier 34. The amplified radio signal is outputted through a coupler 38. Meanwhile, the input radio signal is also converted to a digital data signal by passing through a logarithmic amplifier (LOG AMP) 27 and an A/D converter 28-1, both of which are incorporated in a power meter 29. Afterwards, the digital data signal is provided to a data processing unit 30-1.

Then, the amplified radio data signal outputted from the power amplifier 34 is delivered to a multiplier circuit 33-1 through the directional coupler 38 and combined with the local frequency 32-1 thereat. The coupled signal from the multiplier circuit 33-1 is then subjected to a band-pass filter 31 to have a limited frequency band. Next, the signal with the limited frequency band is inputted to the data processing unit 30-1 through an A/D converter 28-2. The data processing unit 30-1 operates by an algorithm for minimizing a level of the signal passing through the band-pass filter 31, i.e., off-band spectrum components generated by non-linear distortion characteristics of the power amplifier 34.

The data processing unit 30-1 refers to addresses of memory circuits 26-1 and 26-2 based on the digital data signal provided from the power meter 29 to thereby control the gain control circuit 23 and the phase control circuit 24 through D/A converters 25-1 and 25-2, respectively. The contents of the memory circuits 26-1 and 26-2 are determined on a trial and error basis such that the non-linear distortion of the power amplifier 34 becomes minimized.

Referring to FIG. 16B, there is provided a conventional distortion compensation amplification apparatus of the base band signal input type.

Carrier offset circuits 35-1 to 35-4 serve to offset carrier frequencies against respective input digital channel data based on carrier information for each input channel. The carrier offset circuit may be implemented, for example, by a complex multiplier. The outputs from the carrier offset circuits 35-1 to 35-4 are provided to an adder 39, which generates, in response thereto, a combined base band signal to the complex multiplier 36 and a power meter 29.

The complex multiplier 36 controls the phase and the amplitude of the combined base band signal. Thereafter, the thus processed base band signal is subjected to a D/A converter 25-4 and a quadrature amplitude modulation unit (hereinafter, a QAM-MOD) 37, successively, and, then, combined with a signal from a local oscillator 32-2 at a multiplier circuit 33-2. Subsequently, the combined signal is transferred as a radio signal to the power amplifier 34 to be amplified thereat and finally outputted through a directional coupler 38. An algorithm for minimizing non-linear distortion of the power amplifier 34 controls, as in the earlier-described radio signal input type, the complex multiplier 36 based on a power level of the base band signal, to thereby adjust the phase and the amplitude of the base band signal. That is, a data processing unit 30-2 refers to an address of a memory circuit 26-4 based on power level of the base band signal obtained from the power meter 29 to thereby control the complex multiplier 36. The contents of the memory circuit 26-4 which stores complex control values are determined on a trial and error basis such that the non-linear distortion can be minimized.

Recently, the number of mobile subscribers has been rapidly increased. Therefore, in order to cope with such ever-increasing demand a greater number of base stations need to be implemented as well in a same service area. Accordingly, operation costs and maintenance repair costs have been continuously increased and, thus, base station providers have sought to reduce the costs in many ways.

One way to cut the operation costs is to reduce the power consumption.

A transmitter power amplifier of the base station consumes a considerable amount of power at a constant rate regardless of the relative strength of the output signal transmitted by the base station. For instance, in daytime, the RF output power level consumed for a normal traffic load is about 10 watts and DC prime power consumed by the transmitter power amplifier is about 80 to 100 watts. However, in the middle of nighttime when the traffic load becomes light, the RF output power level of the transmitter may be reduced in decrements down to, e.g., about 1 watt due to the power control conducted over the RF output signal as described above. However, since an operation bias point is fixed in the conventional power amplifier, the DC prime power consumed by the transmitter power amplifier in the nighttime is not reduced but still remains unchanged at about 80 to 100 watts as in the daytime.

Accordingly, it would be advantageous to develop a power control technique capable of reducing the DC power consumption of a power amplifier of a base station while maintaining the existing output RF power level. In such a CDMA mobile communications system, it is required to monitor and maintain an RF output signal level as needed and, concurrently, to reduce the DC power level required to generate the target RF output signal level.

SUMMARY OF THE INVENTION

It is, therefore, an object of the present invention to provide a distortion compensation amplification apparatus capable of lowering consumption power by way of bias control.

In accordance with a preferred embodiment of the present invention, there is provided a feed forward type distortion compensation amplification apparatus, including: a distortion detection loop having a first phase shifter, a first amplitude adjuster and a main amplifier; a distortion compensation loop having a second phase shifter, a second amplitude adjuster and an error amplifier; means for canceling a first distortion element generated from the distortion detection loop by a second distortion element generated from the distortion compensation loop and generating an output signal; and a bias controller for controlling bias levels of the main amplifier and the error amplifier based on a level of the output signal.

In accordance with another preferred embodiment of the present invention, there is provided an adaptive pre-distortion type distortion compensation amplification apparatus, including: a detection unit for detecting an input power level; a control unit for storing the input power level and a bias level corresponding thereto and generating the bias level in response to the input power level; and a bias control unit for applying a bias to an amplifier unit in response to the bias level.

In accordance with still another preferred embodiment of the present invention, there is provided a distortion compensation amplification apparatus, including: a detection unit for detecting a level of an input signal; an amplification unit for amplifying the input signal; and means for stepwise controlling a bias of the amplification unit based on the level of the input signal detected by the detection unit.

In accordance with still another preferred embodiment of the present invention, there is provided a distortion compensation amplification apparatus, including: an amplification unit for amplifying an input signal; a detection unit for detecting a level of an output signal; and means for controlling a bias of the amplification unit based on the level of the output signal detected by the detection unit.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The inventive features of the present invention can be realized by any other circuits or apparatus than those described in the preferred embodiments of the invention as long as they can realize such features. Further, some or all of the functions thereof may be implemented by software. In addition, each of certain functional elements of the system can be implemented by a plurality of circuits or a multiplicity of such functional elements thereof can be configured by a single circuit.

Figure 1:
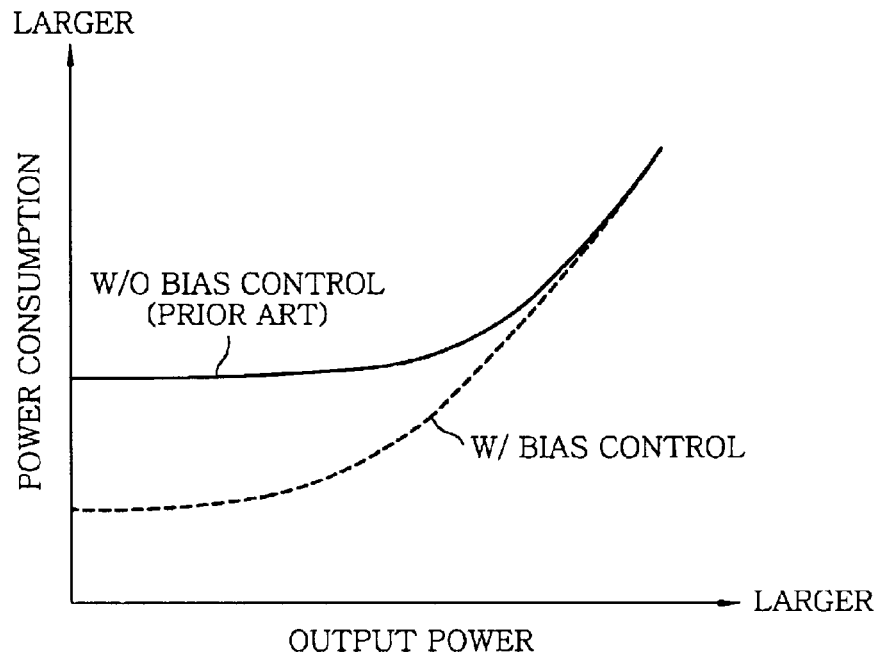
FIG. 1 describes a graph for illustrating a relationship between the power consumption level and the output power level of an amplifier with and without bias control.

In a distortion compensation amplification apparatus of a feed forward type, class AB amplifiers or class B amplifiers are generally used. Such amplifiers have characteristics that power consumption level decreases with the reduction of the output power level, as shown in FIG. 1. Since, however, an idle current needs to be set in such an amplifier, the power consumption level of the amplifier may not be reduced below a predetermined power level corresponding to the idle current of the amplifier.

Figure 2:
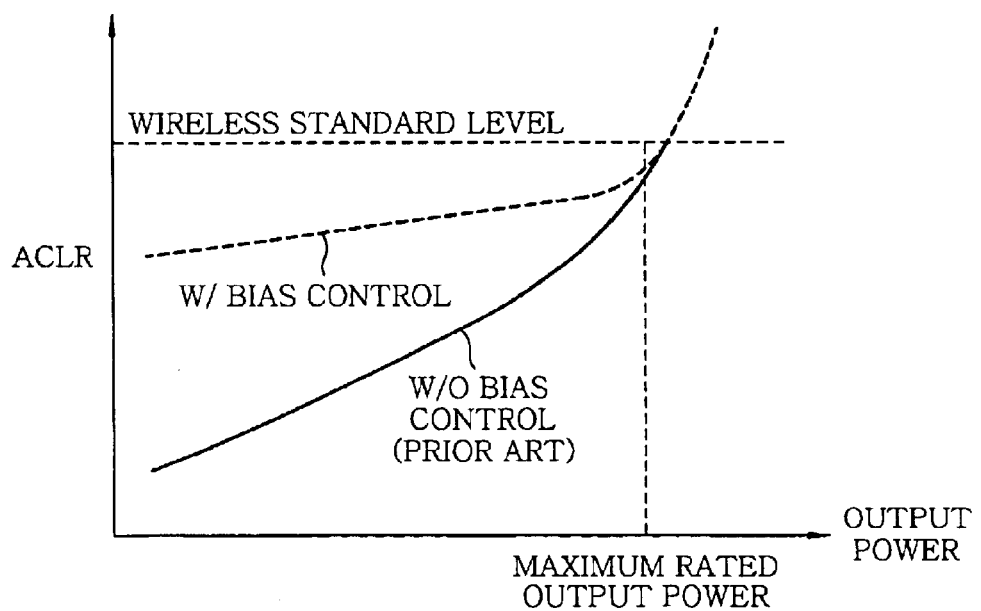
FIG. 2 illustrates a graph for illustrating a relationship between an ACLR of an amplifier and an output power level of an amplification apparatus with and without bias control.

Further, in terms of certain wireless characteristics, for example, an ACLR (Adjacent Channel Leakage power Ratio) of a CDMA signal, conventional main and error amplifier exhibit a large ACRL margin for a wireless standard level at a low output power level, as can be seen from an ACLR curve represented by a solid line shown in FIG. 2. Since an amplifier would need to satisfy the wireless characteristics, a bias control for the main and the error amplifier can be performed when the amplifiers operate, particularly, at a low output power level, in accordance with the present invention as represented by a dashed line in FIG. 2. The detailed explanation thereof will be described hereinafter.

Figure 3:
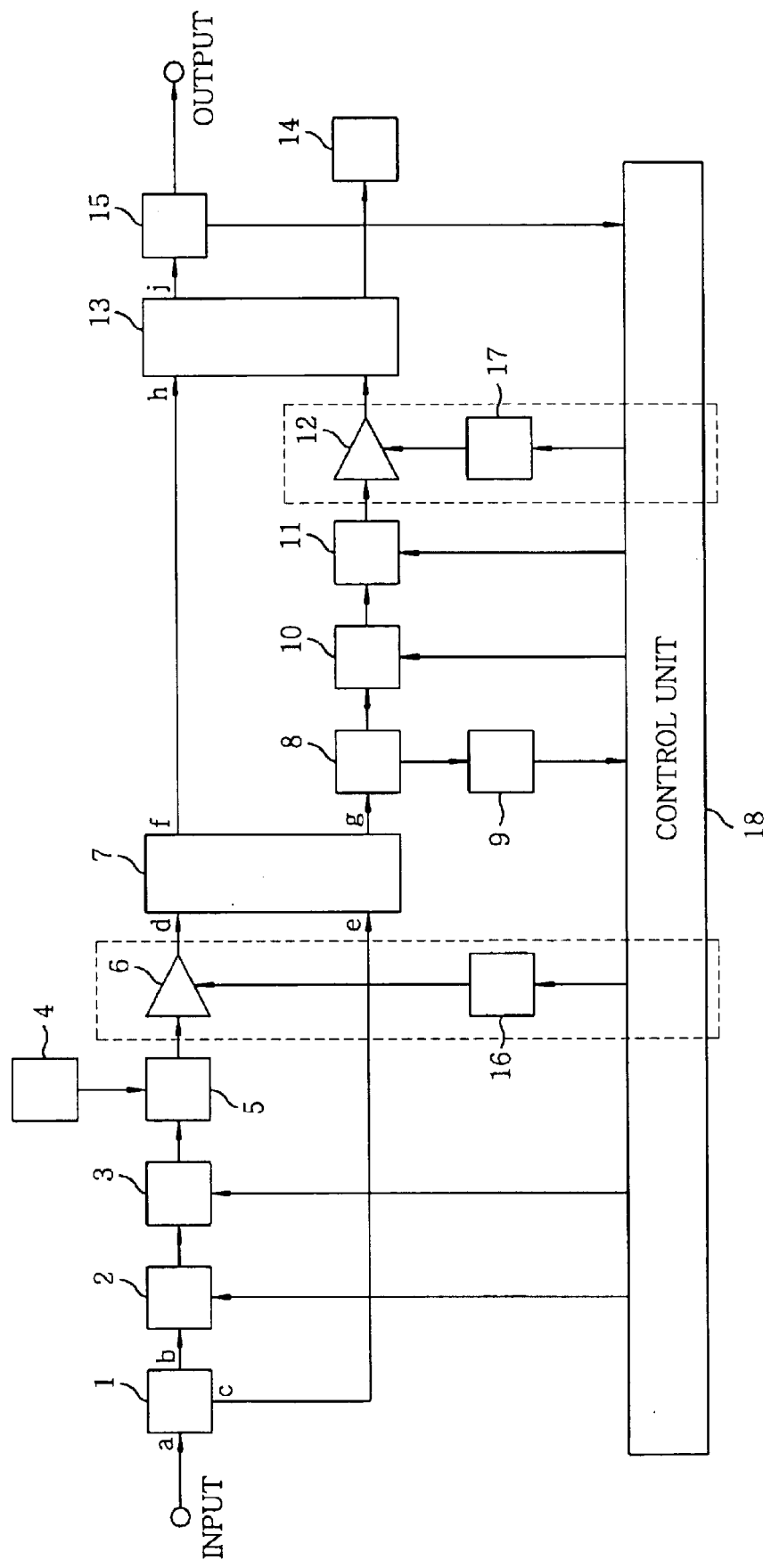
FIG. 3 shows a block diagram of a distortion compensation amplification apparatus using a feed forward technique in accordance with a first preferred embodiment of the present invention.
Figure 15:
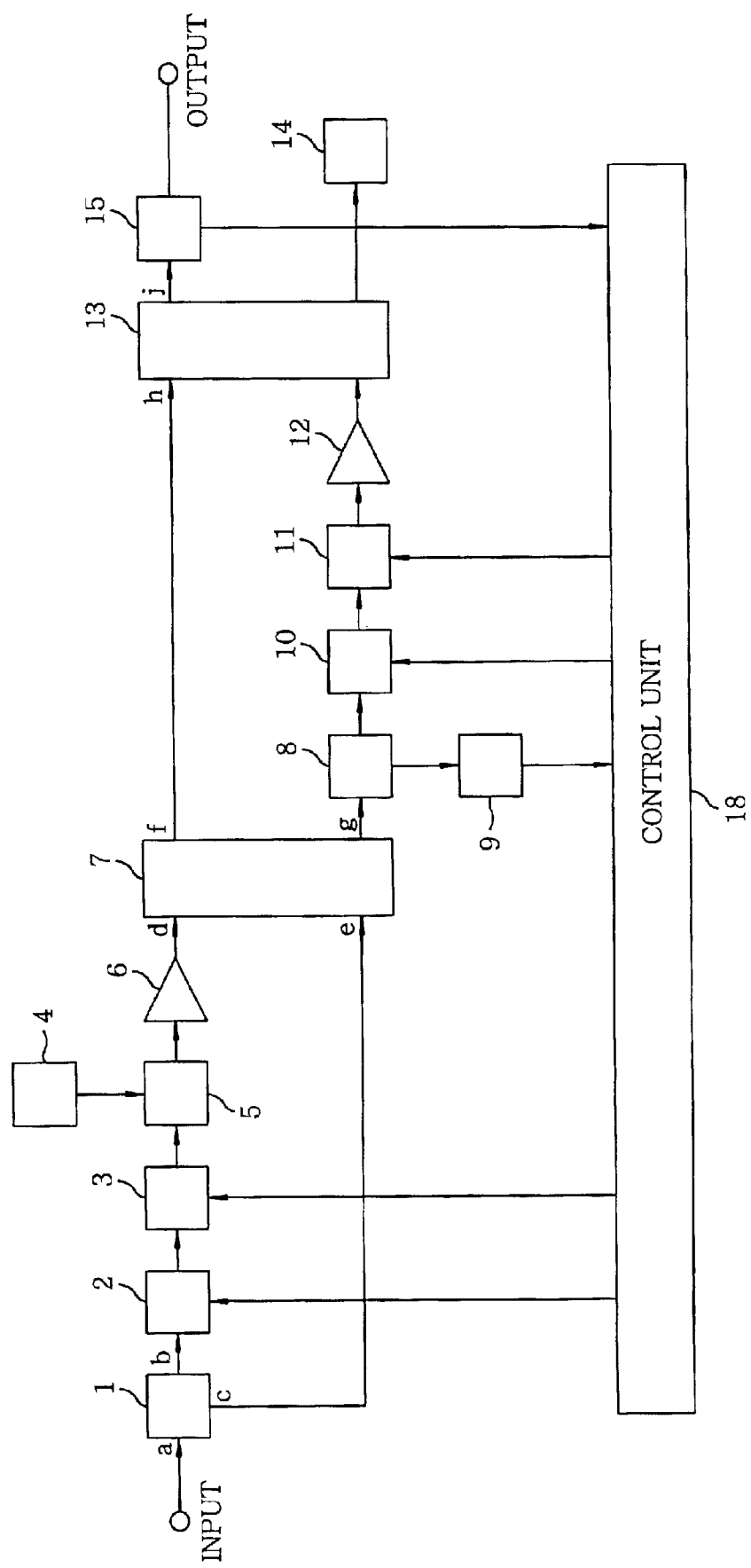
FIG. 15 shows a block diagram of a conventional distortion compensation amplification apparatus of the feed forward type.

FIG. 3 shows a block diagram of a distortion compensation amplification apparatus using a feed forward technique in accordance with a first preferred embodiment of the present invention. Since some elements of the distortion compensation amplification apparatus in FIG. 3 are identical to those of the conventional distortion compensation amplification apparatus shown in FIG. 15, the same reference numerals are used to denote and identify corresponding or identical elements of the conventional distortion compensation conventional amplification apparatus, and the detailed description thereof will be omitted.

A first bias control unit in the form of a main amp bias control circuit 16 performs a bias control of a main amplifier 6 and a second bias control unit in the form of an error amp bias control circuit 17 performs a bias control on an error amplifier 12.

Figure 4:
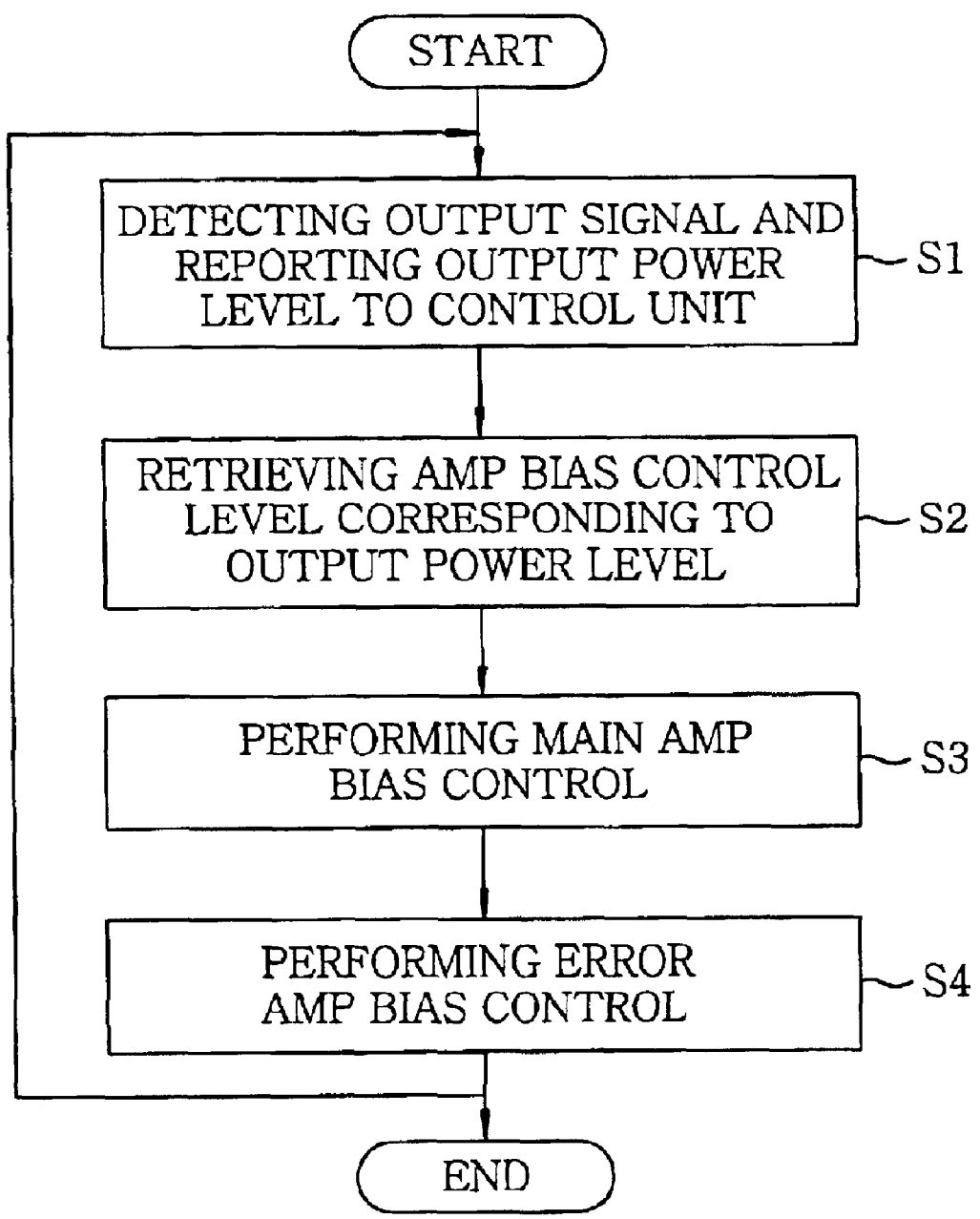
FIG. 4 offers a flow chart for illustrating a process for performing the bias control of the distortion compensation amplification apparatus of FIG. 3.
Figures 5, 6:
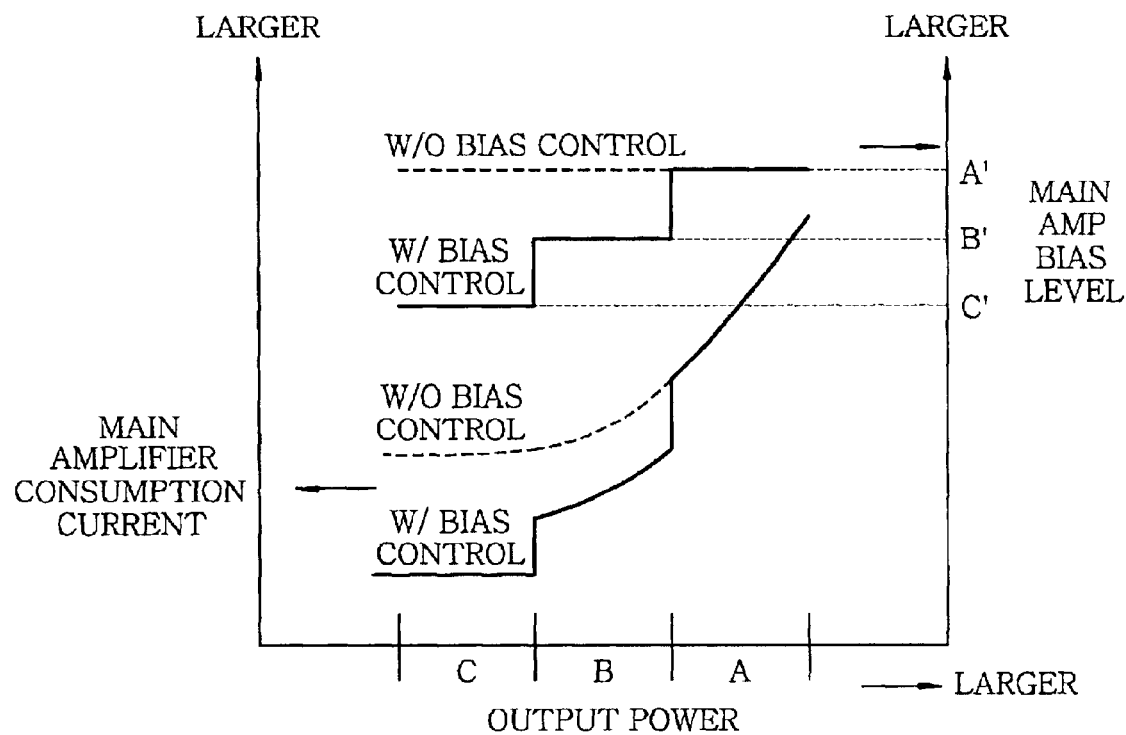
FIG. 5 is a memory table for illustrating main amp bias levels and error amp bias levels defined in terms of output power levels.
FIG. 6 presents graphs for illustrating a bias level and a consumption current of a main amplifier in terms of an output power level of an amplification apparatus with and without bias control.

The operation of the distortion compensation amplification apparatus in FIG. 3 will be described with reference to a flow chart of FIG. 4. On detecting an output signal of the amplification apparatus from a divider 13, a coupler 15 reports a power level of the output signal to a control unit 18 at step S1. The control unit 18, which stores in its memory (not shown) bias levels for the main amplifier 6 and the error amplifier 12 as a function of output power level as shown in FIG. 5, retrieves a main amp bias level for the main amplifier 6 and an error amp bias level for the error amplifier 12 in response to the output power level at step S2. Based on the retrieved main amp bias level, the main amp bias control circuit 16 performs a bias control on the main amplifier 6 at step S3 and, further, based on the retrieved error amp bias level, the error amp bias control circuit 17 performs a bias control on the error amplifier 12 at step S4.

As shown in FIG. 5, a memory table defined in the memory of the control unit 18 specifies, e.g., three output power levels A, B and C of the amplification apparatus and their corresponding main amp bias levels and error amp bias levels. A relationship between bias levels for an amplifier and output power levels will be described in detail with reference to FIGS. 6 and 7.

First, the relationship between a main amp bias level of the main amplifier 6 and an output power level of the amplification apparatus with and without a bias control is described in FIG. 6. The abscissa represents an output power level, the right ordinate represents a main amp bias level, and the left ordinate represents a consumption current of the main amplifier 6. Dashed lines and solid lines respectively represent the cases with and without bias control. In case the output power level is high (level A), the main amp bias levels with and without bias control are identical to be A' and therefore the consumption currents also become equal. When the output power level is B, the applied main amp bias level with bias control is reduced down to the level B' and the consumption current of the main amplifier 6 in the bias control state becomes smaller than that of the main amplifier 6 in the bias fixed state. If the output power level is the lowest output power level C, the main amp bias level in the bias control state becomes the level C', being lower than B', and the current consumption of the main amplifier 6 in the bias control state becomes further decreased as shown in FIG. 6.

Figure 7:
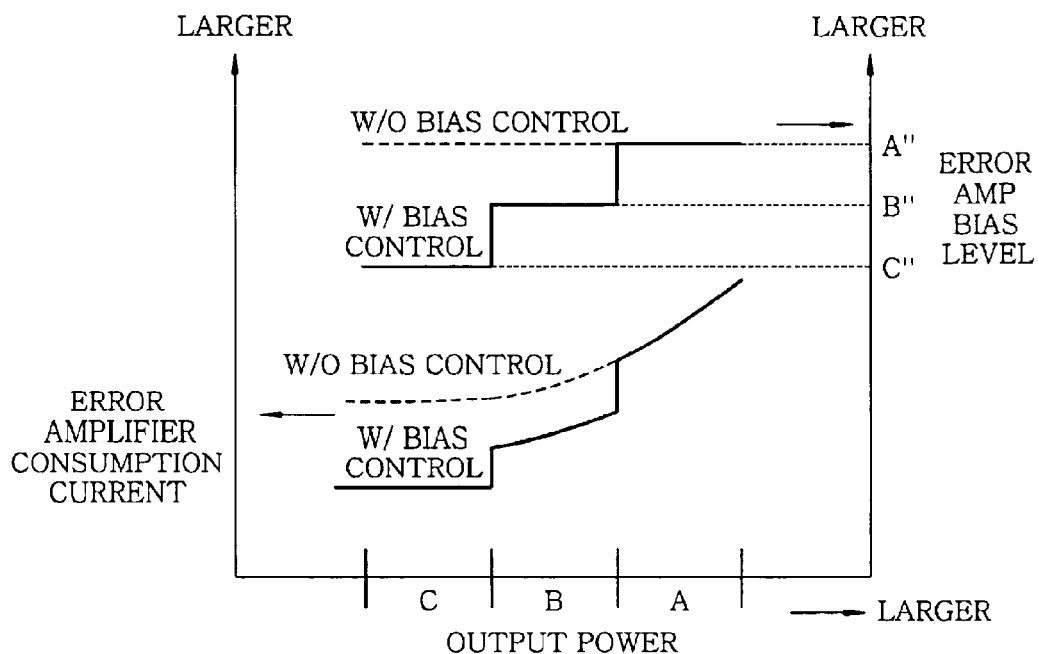
FIG. 7 provides graphs for illustrating a bias level and a consumption current of an error amplifier as a function of an output power level of an amplification apparatus with and without bias control.

FIG. 7 provides graphs for illustrating the relationship between an error amp bias level of the error amplifier 12 and an output power level of the amplification apparatus with and without bias control. The abscissa represents an output power level, the right ordinate represents an error amp bias level, and the left ordinate represents a consumption current of the error amplifier 12. Dashed lines and solid lines respectively represent the cases with and without a bias control.

In case the output power level is high (level A), the error amp bias levels with and without bias control are identical to A" and therefore the consumption currents also become equal. When the output power level is B, the applied error amp bias level with bias control is reduced down to the level B" and the consumption current of the error amplifier 12 in the bias control state becomes smaller than that of the error amplifier 12 in the bias fixed state. If the output power level is the lowest output power level C, the error amp bias level in the bias control state becomes the level C", being lower than B", and the current consumption of the error amplifier 12 in the bias control state becomes further decreased as shown in FIG. 7.

Figure 8:
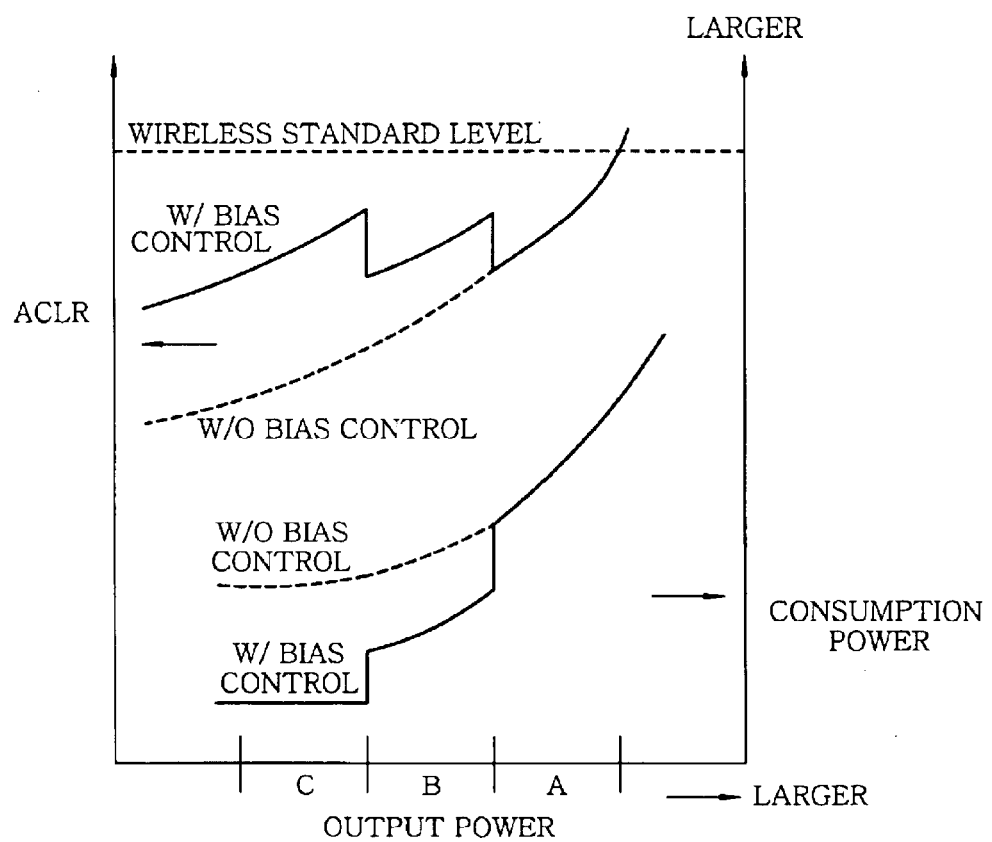
FIG. 8 depicts a graph for illustrating a relationship of an ACLR and consumption power of an amplification apparatus versus an output power level with and without bias control.

FIG. 8 depicts a graph for illustrating an ACLR and a consumption power of the amplification apparatus as a function of an output power level with and without bias control. The abscissa represents an output power level, the right ordinate represents consumption power, and the left ordinate represents an ACLR. Dashed lines and solid lines respectively represent the cases with and without a bias control.

As shown in FIG. 8, by performing a bias control in response to an output power level of the amplification apparatus, power consumption of the amplification apparatus can be reduced while satisfying the required wireless characteristics Further, by performing a bias control in response to an output power level of the amplification apparatus as shown in FIGS. 6 and 7, total power consumption of the amplification apparatus can be reduced.

It was assumed in the preferred embodiment that the output power levels are divided into three levels A, B and C. It should be noted, however, that the output power levels can be more finely divided, even into, e.g., non-discrete continuous levels. Such case is represented as, for example, dashed curves shown in FIGS. 1 and 2.

Figure 9:
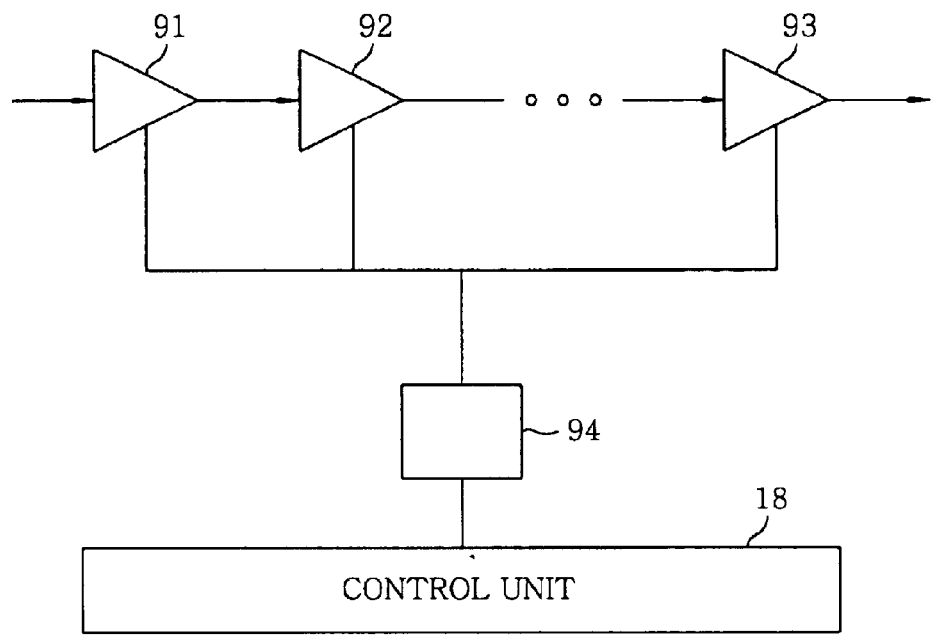
FIG. 9 represents a block diagram for illustrating a first configuration of a bias control block in accordance with the present invention.
Figure 10:
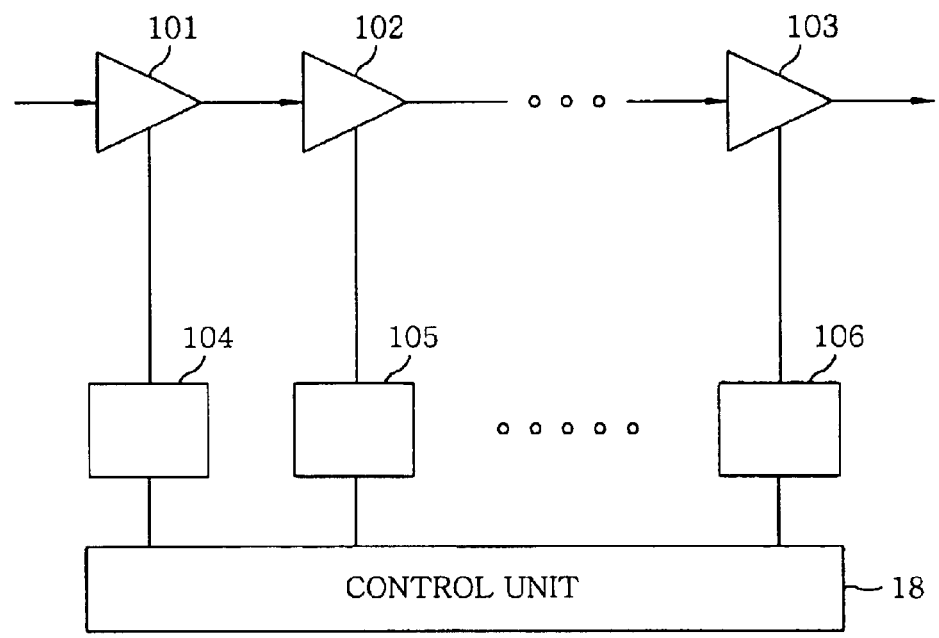
FIG. 10 sets forth a block diagram for illustrating a second configuration of a bias control block in accordance with the present invention.

FIGS. 9 and 10 represent bias control blocks for bias control of amplifiers in accordance with the present invention. The bias control blocks correspond to a dashed block having the main amplifier 6, the main amp bias control circuit 16 and the control unit 18 or a dashed block having the error amplifier 12, the error amp bias control circuit 17 and the control unit 18 in the amplification apparatus of FIG. 3. The amplifiers in the bias control blocks can be configured with a plurality of main amplifier units or error amplifier units as shown in FIGS. 9 and 10.

Referring to FIG. 9, a plurality of amplifier units 91–93 in the bias control block are controlled by a single amp bias control circuit 94. The amplifier is constructed with cascaded small-power amplifier unit 91, medium-power amplifier unit 92 and large-power amplifier unit 93. In this case, bias control corresponding to an output power level can be performed for the amplifier units 91, 92 and 93 by only a single amp bias control circuit 94.

FIG. 10 sets forth a bias control block including a plurality of amplifier units and the same number of amp bias control circuits. The amplifier is constructed with a small-power amplifier unit 101, a medium-power amplifier unit 102 and a large-power amplifier unit 103.

In this case, bias control corresponding to an output power level can be performed for each of the amplifier units 101, 102 and 103 by its corresponding amp bias control circuits 104, 105 or 106, enabling independent bias control to be performed for each of the amplifier units. As a result, it becomes possible to control bias levels of selected amplifier units differently.

For instance, since power consumption of a large-power amplifier unit and a medium-power amplifier unit dominates the total power consumption of an amplification apparatus, efficient power saving can be achieved by fixing a bias level of a small-power amplifier unit and performing bias controls of a medium-power amplifier unit and a large-power amplifier unit.

Although the amplifier units and the amp bias control circuits are shown in FIGS. 9 and 10 to be of a one-to-one correspondence or a multi-to-one correspondence, it should be noted, that the number of bias control circuits can be varied. For instance, the bias control block can be configured in such a manner that more than one, but not greater than the number of amplifier units, bias control circuit performs bias controls of the amplifier blocks.

Figure 11A:
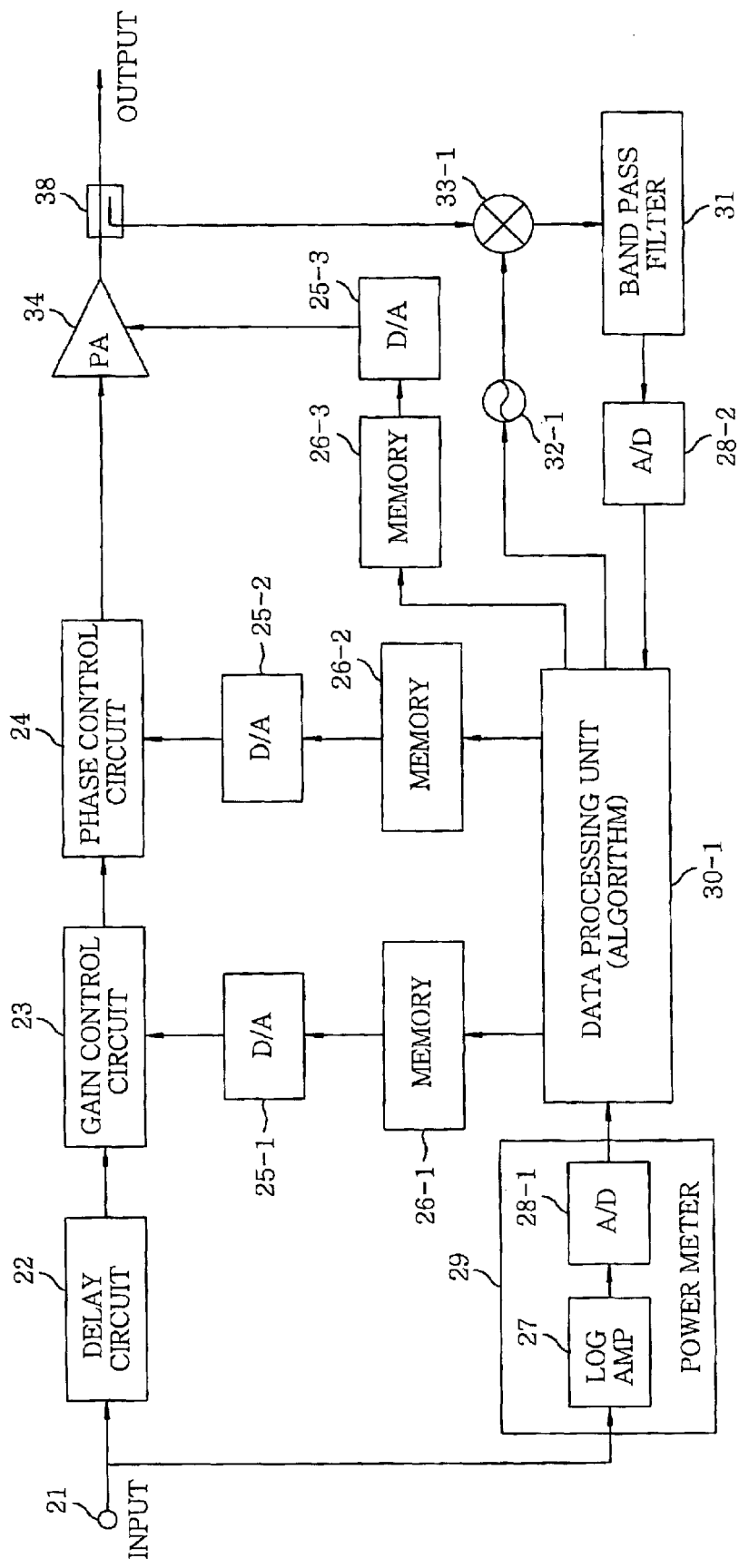
FIG. 11A shows a block diagram of a distortion compensation amplification apparatus of the adaptive pre-distortion compensation (ADP) type using the radio signal input in accordance with a second preferred embodiment of the present invention.
Figure 11B:
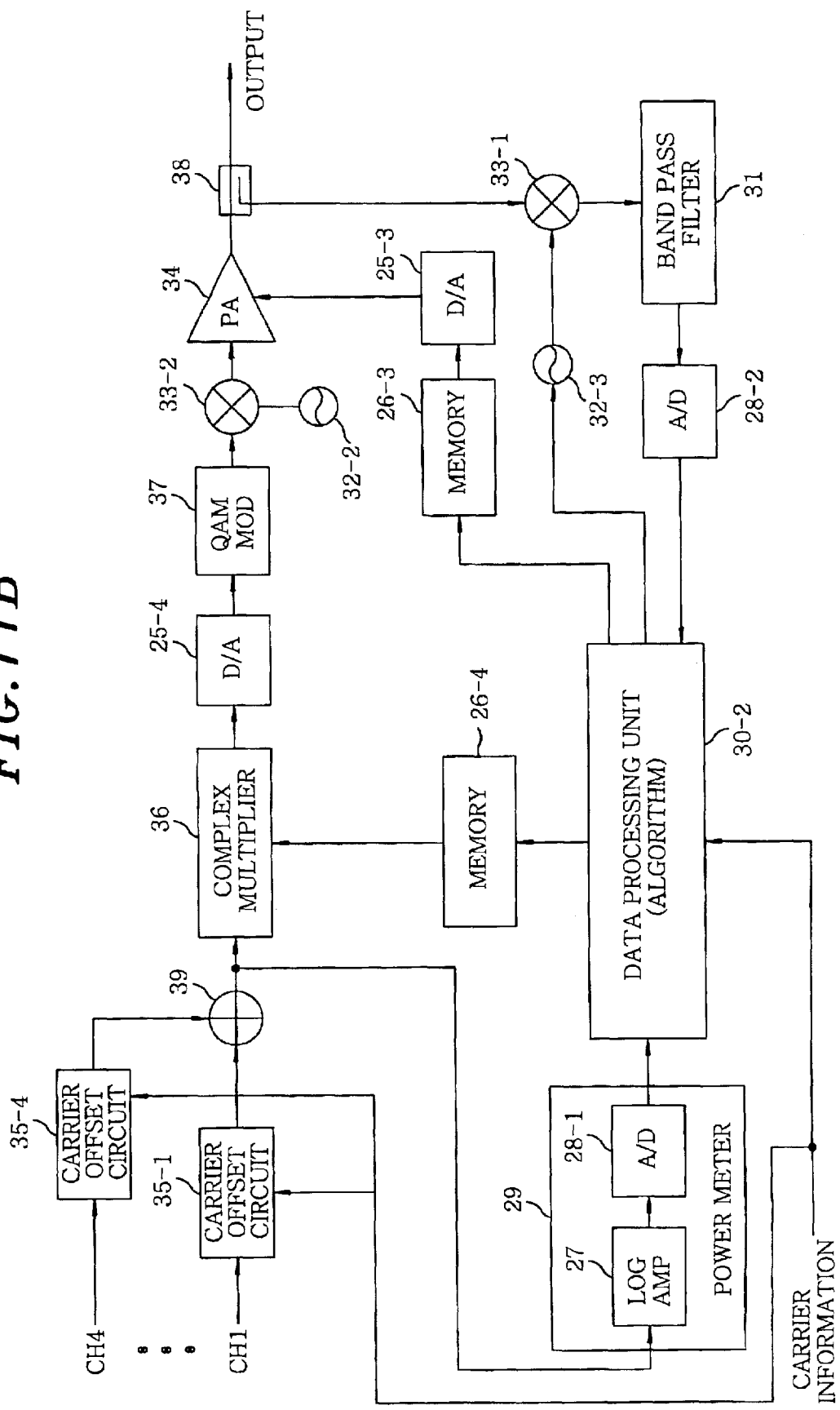
FIG. 11B shows a block diagram of a distortion compensation amplification apparatus of the ADP type using the base band signal input in accordance with a third preferred embodiment of the present invention.
Figure 16A:
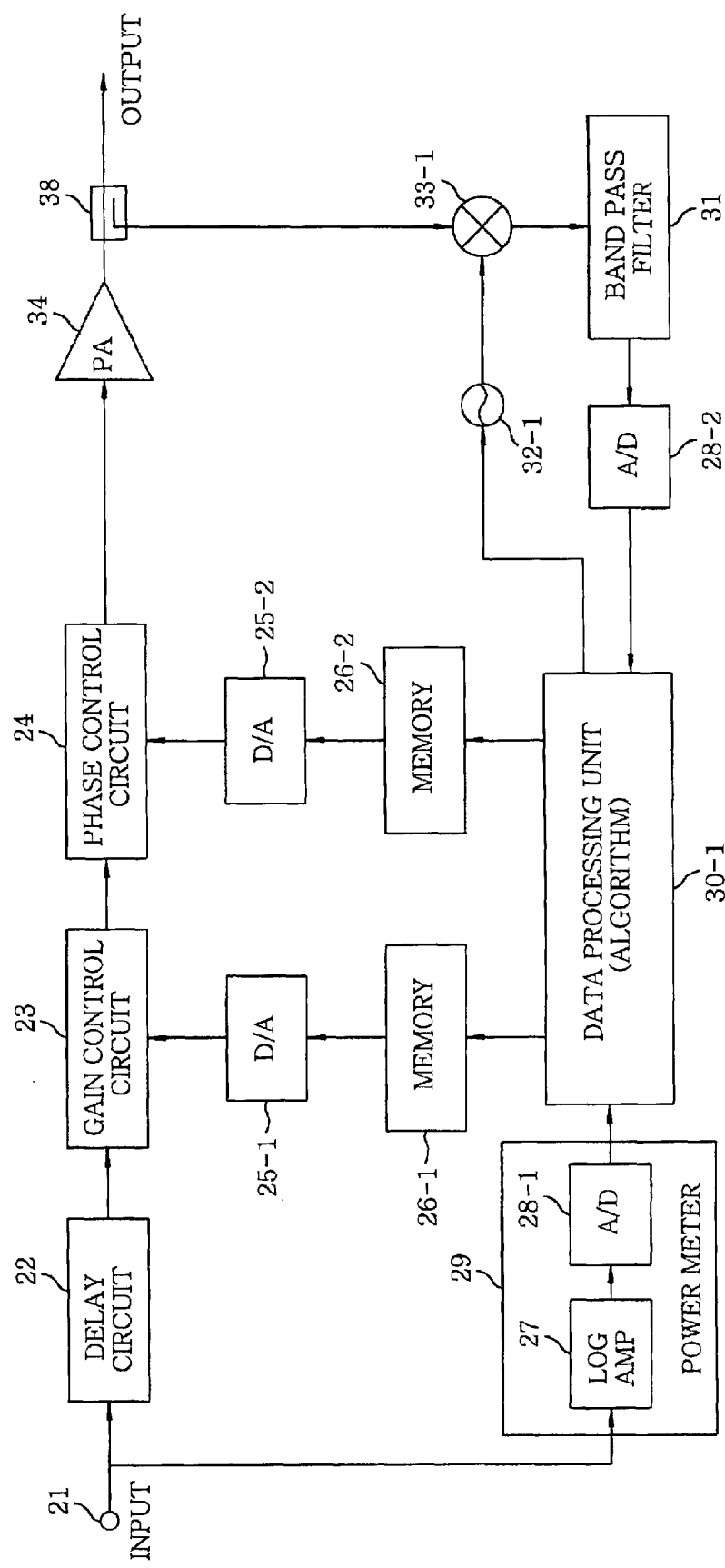
FIG. 16A shows a block diagram of a conventional distortion compensation amplification apparatus of the ADP type using a radio signal input.
Figure 16B:
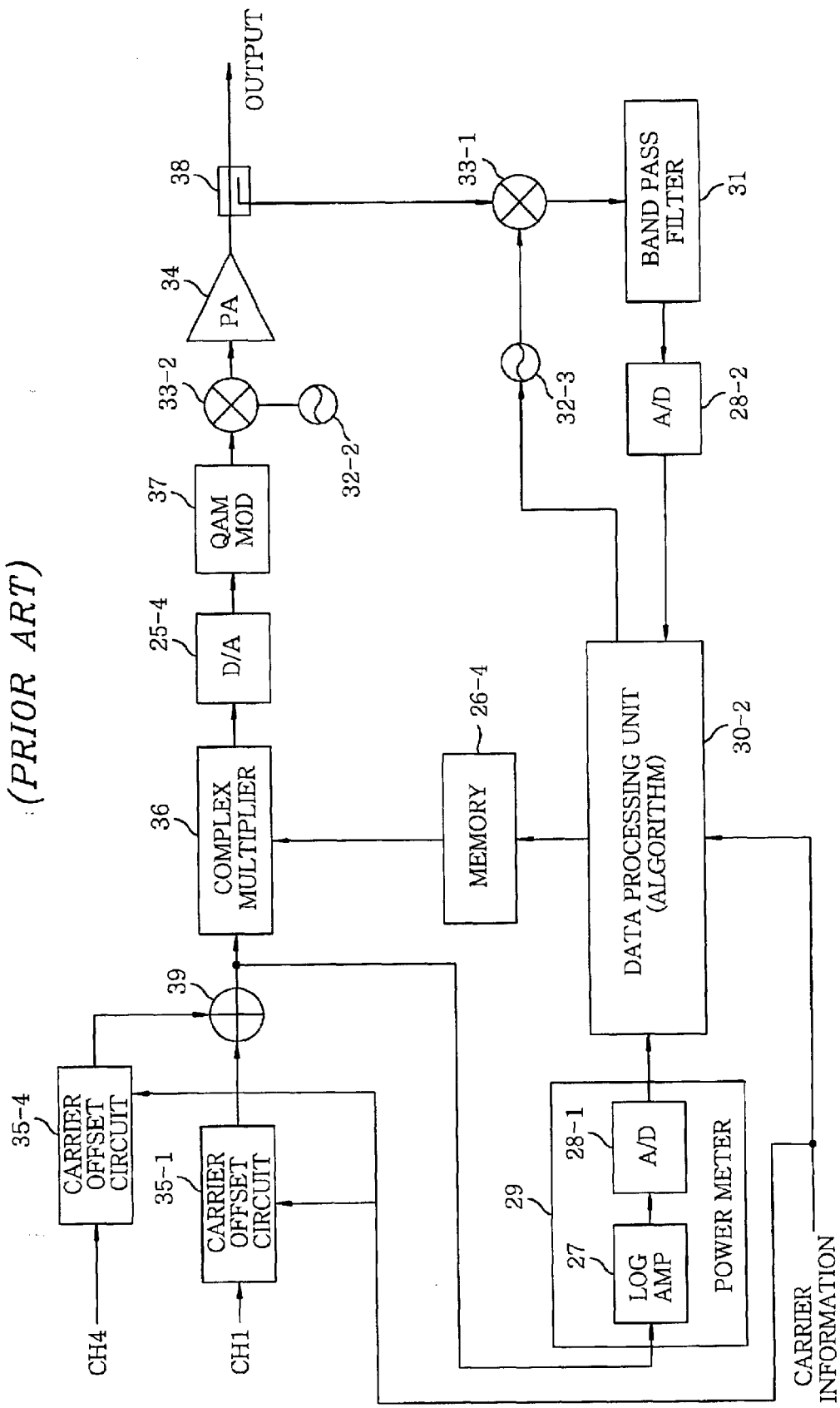
FIG. 16B shows a block diagram of a conventional distortion compensation amplification apparatus of the ADP type using a base band signal input.

FIG. 11A shows a block diagram of a distortion compensation amplification apparatus in accordance with a second preferred embodiment of the present invention, which uses the ADP (adaptive pre-distortion compensation) technique with an RF signal input. FIG. 11B shows a block diagram of a distortion compensation amplification apparatus in accordance with a third preferred embodiment of the present invention, which uses the ADP technique with a base band signal input. Both of the distortion compensation amplification apparatuses as shown in FIGS. 11A and 11B further include a memory 26-3 and a D/A converter 25-3 for performing a bias control of a power amplifier 34 in comparison with the conventional distortion compensation amplification apparatuses as shown in FIGS. 16A and 16B. The distortion compensation amplification apparatuses of the second and the third embodiment perform a bias control such that a bias level is optimized while satisfying the wireless characteristics, e.g., ACLR, especially at the region of low output power levels having a large margin with respect to the wireless standard.

Figure 12:
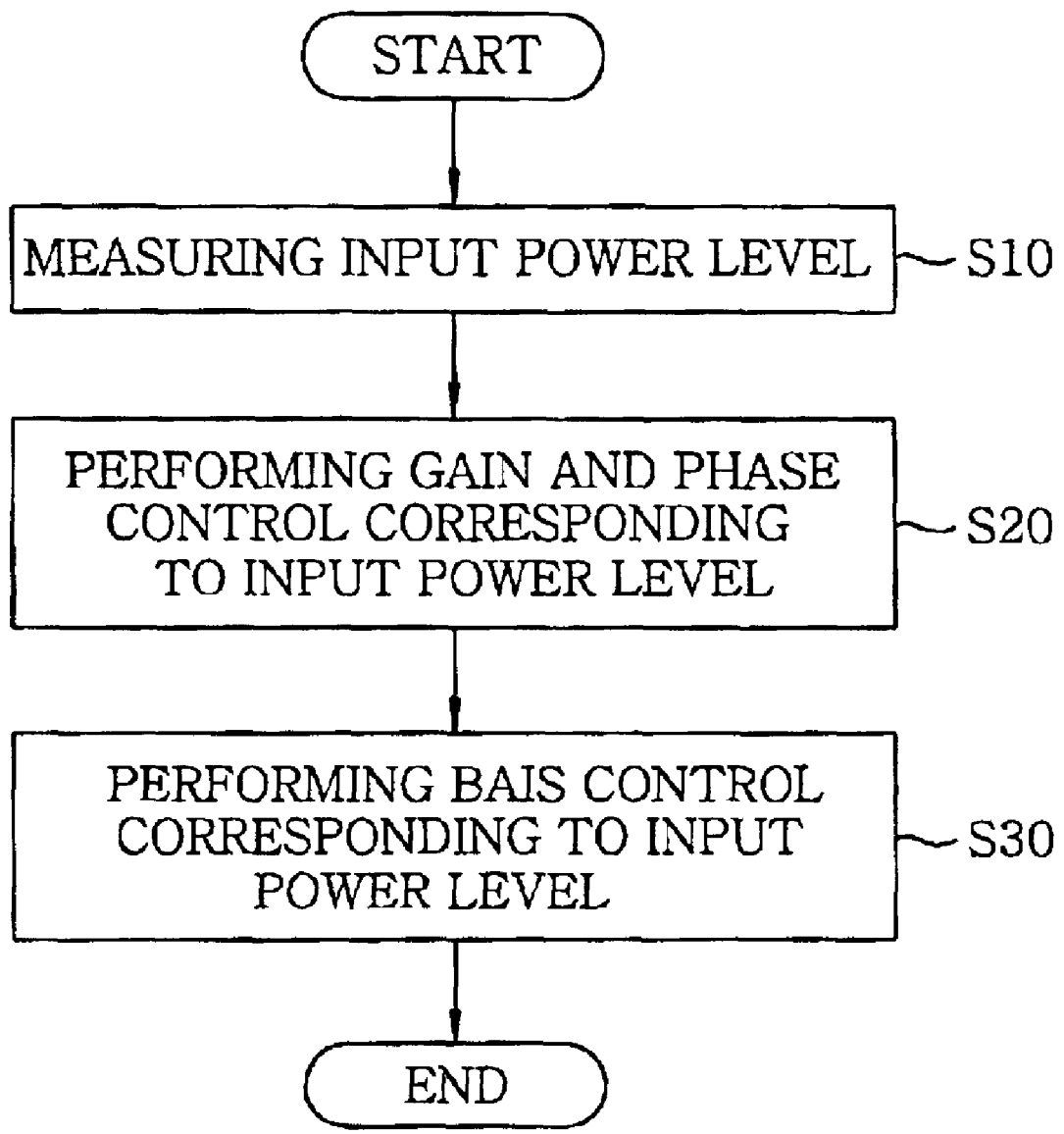
FIG. 12 offers a flow chart illustrating a process for performing the bias control for the distortion compensation amplification apparatuses of FIGS. 11A and 11B.

FIG. 12 offers a flow chart illustrating a process for performing bias controls for the power amplifier 34 shown in each of FIGS. 11A and 11B. When an input power level is measured by a power meter 29 in each of the distortion compensation amplification apparatuses of FIGS. 11A and 11B at step S10, a gain control and a phase control corresponding to the input power level are performed at step S20 and a bias control corresponding to the input power level is performed at step S30.

Referring back to FIG. 2, the ACLR increases and its margin for the wireless standard decreases as the output power level goes near a maximum rated level. Since the output power level increases in proportion to input power level, the ADP technique can capture an output power level by monitoring the input power level and thereby can reduce the amount of consumption current of the amplification apparatus in such a manner that ACLR falls within the wireless standard level at low output power levels.

Figures 13A, 13B:
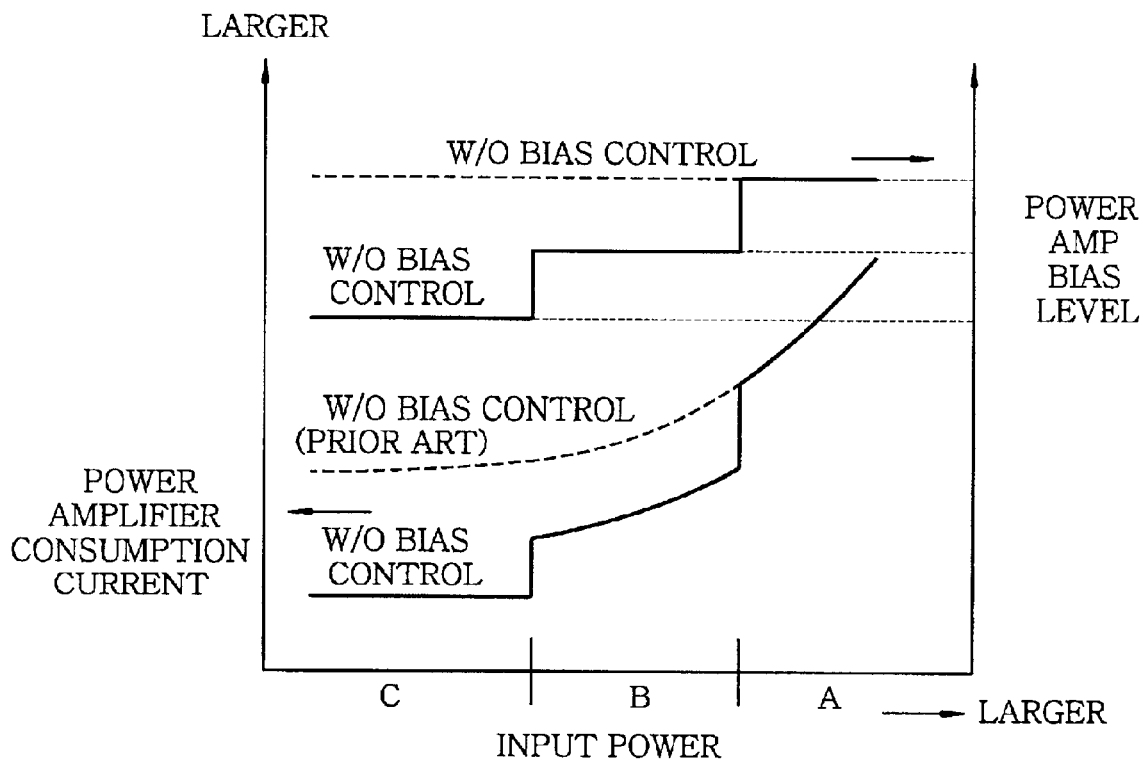
FIG. 13 presents a graph for illustrating a relationship of an amp bias level and consumption current of an amplifier versus an input power level of the amplification apparatus in FIG. 11A or 11B with and without bias control, and a memory table for illustrating input power levels and amp bias levels.

FIG. 13A, which corresponds to FIG. 6, presents a graph for illustrating a relationship of a bias level and consumption current of the power amplifier 34 versus an input power level of the amplification apparatus with and without bias control. FIG. 13B is a memory table for specifying input power levels of the amplification apparatus and power amp bias levels, which are stored in the memory 26-3. In the memory table of FIG. 13B, the input power levels are divided into three levels of A, B and C. However, by reducing the width of the input power levels, consumption current can be reduced more smoothly without abrupt large variations. For example, it has been formed that consumption current of 5.6 A RMS (root-mean-square) can be reduced down to about 3.3 A RMS, i.e., in decrements of about 40% of current consumption, while maintaining ACLR to fall within the wireless standard level at a low traffic condition and preventing the amplifier from oscillating due to overly reduced current.

Figure 14:
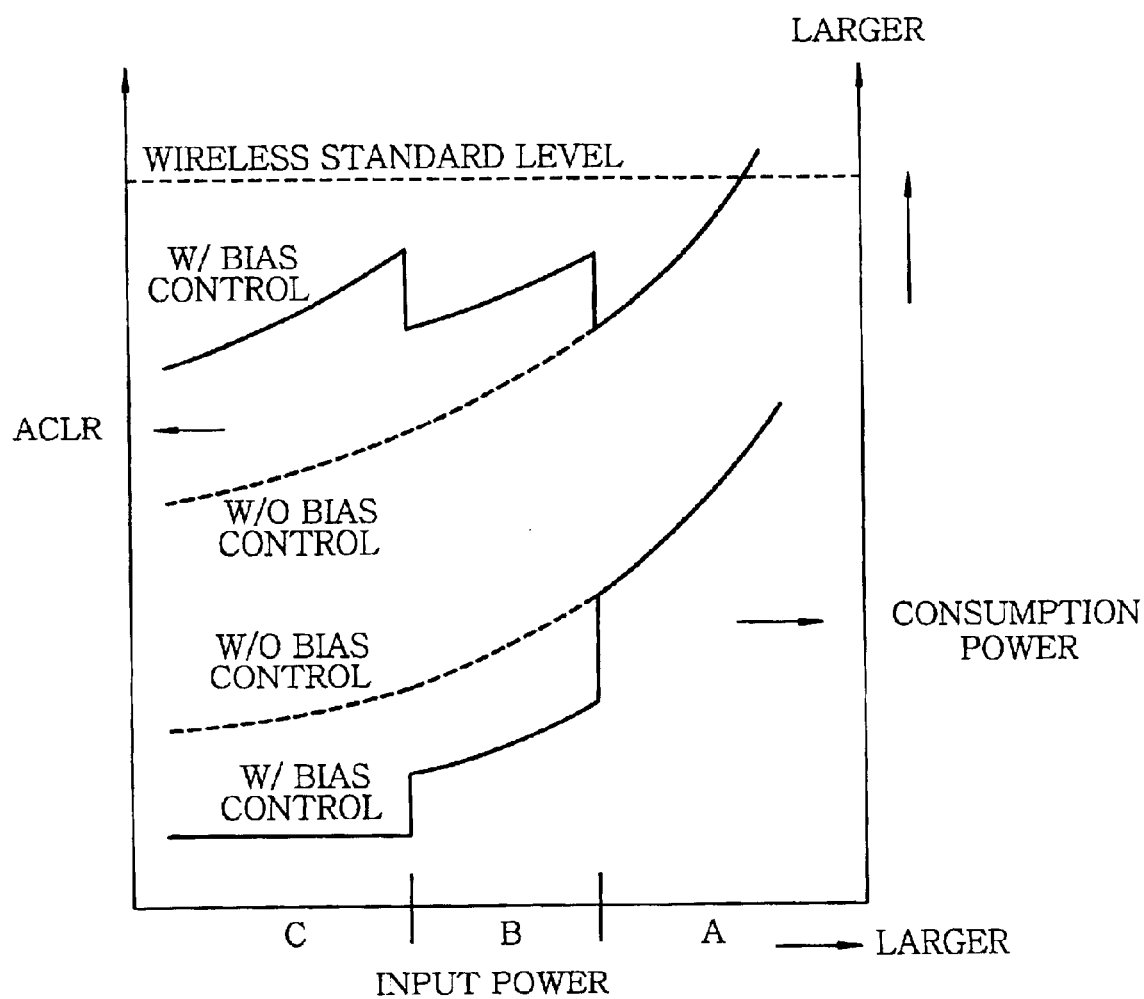
FIG. 14 depicts a graph for illustrating a relationship of ACLR and power consumption of an amplifier versus an input power level of the amplification apparatus shown in FIG. 11A or 11B with and without bias control.

FIG. 14, which corresponds to FIG. 8, depicts a graph for illustrating a relationship of an ACLR and a consumption power of a power amplifier versus an input power level of the amplification apparatus with and without bias control. The ACLR in a bias control state is degraded in comparison with that in a bias fixed state. However, in both levels B and C, the ACLR in a bias control state is still maintained within the wireless standard.

The power amplifier 34 can be implemented by a plurality of amplifier units whose bias levels are collectively or separately controlled in a similar manner as in FIG. 9 or 10.

The present invention has been described with respect to the CDMA communications system. It should be noted, however, that the present invention can be equally applied in controlling amplifiers of base stations of other types of communications system, e.g., TDMA communications system, which consume powers without employing bias control.

While the invention has been shown and described with respect to the preferred embodiments, it will be understood by those skilled in the art that various changes and modifications may be made without departing from the spirit and scope of the invention as defined in the following claims.

What is claimed is:

1. A feed forward type distortion compensation amplification apparatus, comprising:

a distortion detection loop having a first phase shifter, a first amplitude adjuster and a main amplifier;

a distortion compensation loop having a second phase shifter, a second amplitude adjuster and an error amplifier;

means for canceling a first distortion element generated from the distortion detection loop by a second distortion element generated from the distortion compensation loop and generating an output signal; and a bias controller for controlling bias levels of the main amplifier and the error amplifier based on a power level of the cutout signal, wherein the bias controller includes:

a control unit for storing the bias levels of the main amplifier and the error amplifier and retrieving a main amp bias level for the main amplifier and an error amp bias level for the error amplifier in response to the power level of the output signal;

a first bias control unit for controlling a bias of the main amplifier based on the retrieved main amp bias level; and a second bias control unit for controlling a bias of the error amplifier based on the retrieved error amp bias level.

2. The apparatus of claim 1, wherein the power level of the output signal is classified into one of a plurality of output levels and the bias levels of the main amplifier and the error amplifier are determined based on the classified output levels.

3. The apparatus of claim 1, wherein each of the main and the error amplifier includes one or more amplifier units and each of the first and the second bias control unit includes one or more bias control circuits.

4. The apparatus of claim 3, wherein the number of amplifier units included in the main amplifier is identical to that of bias control circuits included in the first bias control unit and the number of amplifier units included in the error amplifier equals to that of bias control circuits included in the second bias control unit.

* * * * *